(12) United States Patent
Kawadahara

(10) Patent No.: US 11,551,934 B2
(45) Date of Patent: Jan. 10, 2023

(54) WAFER SEPARATING METHOD

(71) Applicant: Kioxia Corporation, Minato-ku (JP)

(72) Inventor: Sho Kawadahara, Yokkaichi (JP)

(73) Assignee: Kioxia Corporation, Minato-ku (JP)

(*) Notice: Subject to any disclaimer, the term of this patent is extended or adjusted under 35 U.S.C. 154(b) by 209 days.

(21) Appl. No.: 16/931,625

(22) Filed: Jul. 17, 2020

(65) Prior Publication Data

US 2021/0276815 A1 Sep. 9, 2021

(30) Foreign Application Priority Data

Mar. 4, 2020 (JP) .............................. JP2020-036678

(51) Int. Cl.

| | | |
|---|---|---|
| *H01L 21/00* | (2006.01) | |
| *H01L 21/304* | (2006.01) | |
| *B65G 47/91* | (2006.01) | |
| *H01L 21/673* | (2006.01) | |
| *H01L 21/18* | (2006.01) | |
| *H01L 21/78* | (2006.01) | |
| *H01L 21/683* | (2006.01) | |
| *H01L 21/762* | (2006.01) | |

(52) U.S. Cl.
CPC .......... *H01L 21/304* (2013.01); *B65G 47/918* (2013.01); *H01L 21/187* (2013.01); *H01L 21/67346* (2013.01); *H01L 21/6835* (2013.01); *H01L 21/76254* (2013.01); *H01L 21/7813* (2013.01)

(58) Field of Classification Search
CPC ........... H01L 21/67346; H01L 21/7813; H01L 21/6835; H01L 21/187; H01L 21/76254; H01L 2221/68368; H01L 21/68714; H01L 21/02032; H01L 21/304; H01L 21/67092; B65G 47/918
See application file for complete search history.

(56) References Cited

U.S. PATENT DOCUMENTS

| | | | | |
|---|---|---|---|---|
| 5,897,743 A | * | 4/1999 | Fujimoto | ............... B26D 3/282 156/701 |
| 6,077,383 A | * | 6/2000 | Laporte | ............. H01L 21/67092 156/707 |
| 9,914,233 B2 | | 3/2018 | Landru | |
| 9,962,919 B2 | | 5/2018 | Tang et al. | |
| 2002/0070291 A1 | * | 6/2002 | Yanagita | ........... H01L 21/67092 239/289 |

FOREIGN PATENT DOCUMENTS

| | | |
|---|---|---|
| JP | 2009-214485 A | 9/2009 |
| JP | 5080200 B2 | 11/2012 |
| JP | 2015-534723 A | 12/2015 |
| JP | 6359576 B2 | 7/2018 |
| JP | 6518405 B2 | 5/2019 |

* cited by examiner

*Primary Examiner* — Shouxiang Hu
(74) *Attorney, Agent, or Firm* — Oblon, McClelland, Maier & Neustadt, L.L.P.

(57) ABSTRACT

A wafer separating apparatus is provided which includes a wafer supporting member having an upper surface on which a bonded wafer formed of two wafers bonded with each other is placed; an arm portion arranged outside of the wafer supporting member, the arm portion being movable closer to and away from a bonded portion of the bonded portion of the bonded wafer supported by the supporting portion; and an inflating portion provided in an distal end portion of the arm portion, the inflating portion being inflatable in a direction intersecting the upper surface of the wafer supporting member.

5 Claims, 8 Drawing Sheets

WAFER SEPARATING METHOD

CROSS-REFERENCE TO RELATED APPLICATIONS

This application is based upon and claims the benefit of priority from Japanese Patent Application No. 2020-036678, filed on Mar. 4, 2020; the entire contents of which are incorporated herein by reference.

FIELD

Embodiments according to this disclosure relate to a wafer separating apparatus and a wafer separating method.

BACKGROUND

Some semiconductor storage devices such as semiconductor memory devices have a memory cell chip having memory cell arrays formed therein, and a circuit chip bonded with the memory cell chip and having a control circuit formed therein to control the memory cell arrays. With such a configuration, memory cells can be formed in a space that is once allocated for the control circuit within the memory cell chip, which allows for an increased degree of integration of memory cells.

Production of such semiconductor storage devices includes a process of bonding a wafer where the memory cells are formed and another wafer where the control circuits are formed. While the two wafers need to be aligned with each other with a high degree of accuracy when bonding these two wafers, they may be shifted to each other due to inevitable variations in process. Additionally, when the two wafers are bonded with each other, there may remain air bubbles therebetween, which may lead to a defective electrical connection between the two wafers. When, in such occasions, the two wafers can be separated from each other, and then aligned again with each other and bonded, the wafers can be saved from being discarded, and production yields may be prevented from being decreased.

DETAILED DESCRIPTION

Figure 1:
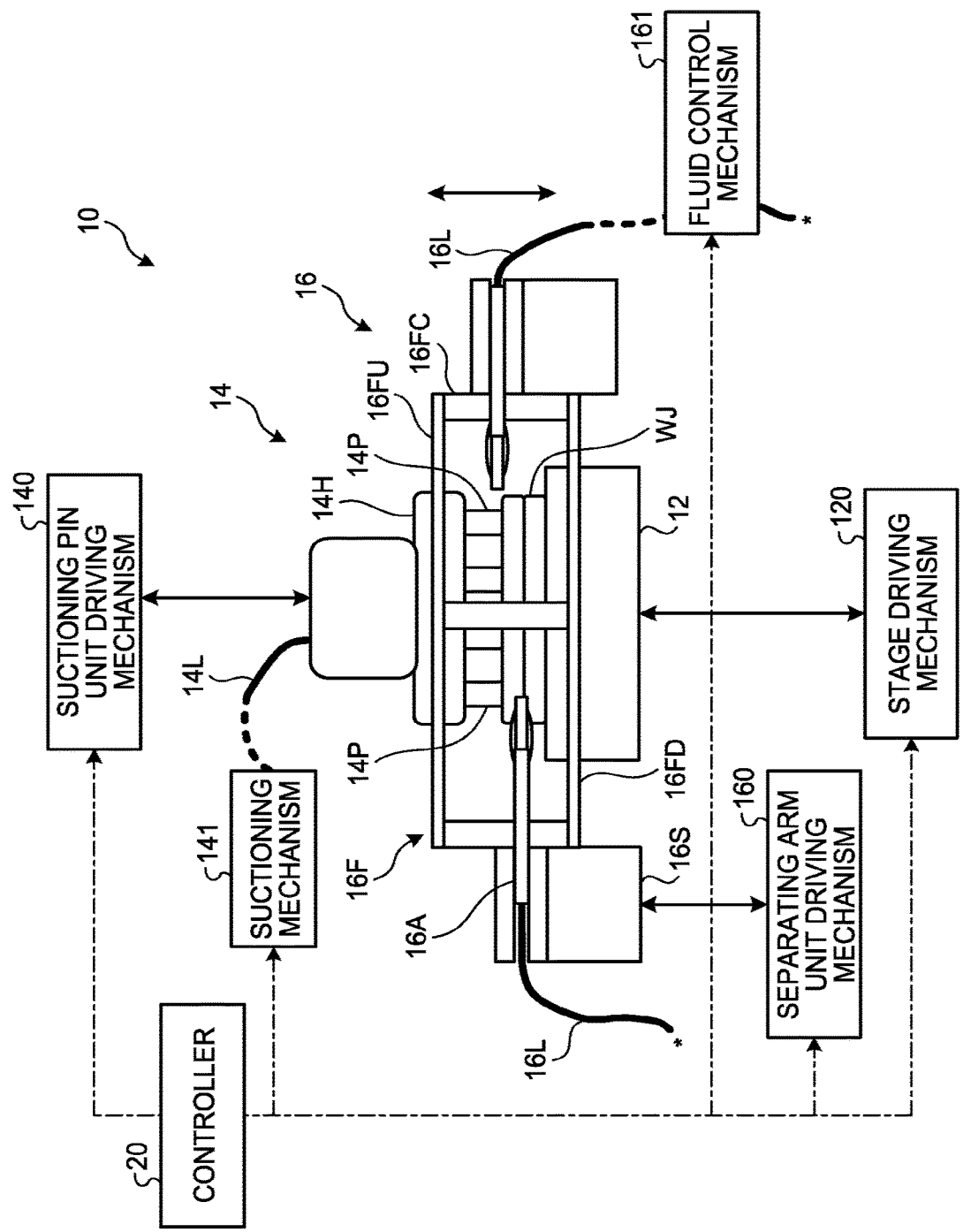
FIG. 1 is a side view schematically illustrating a configuration example of a wafer separating apparatus according to an embodiment.

Non-limiting, exemplary embodiments of the present disclosure will now be described with reference to the accompanying drawings. In the drawings, the same or corresponding reference marks are given to the same or corresponding members or components. It is to be noted that the drawings are illustrative of the disclosure, and there is no intention to indicate scale or relative proportions among the members or components. Therefore, the specific size should be determined by a person having ordinary skill in the art in view of the following non-limiting embodiments One embodiment according to this disclosure provides a wafer separating apparatus. The wafer separating apparatus includes a wafer supporting member having an upper surface on which a bonded wafer formed of two wafers bonded with each other is placed; an arm portion arranged outside of the wafer supporting member, the arm portion being movable closer to and away from a bonded portion of the bonded portion of the bonded wafer supported by the supporting portion; and an inflating portion provided in an distal end portion of the arm portion, the inflating portion being inflatable in a direction intersecting the upper surface of the wafer supporting member.

FIG. 1 is a side view schematically illustrating an example of a wafer separating apparatus according to one embodiment. The wafer separating apparatus is capable of removing a bonded wafer into two constituent wafers.

The bonded wafer is obtained by bonding two wafers, each of which has circuit elements formed therein and is thinned to be about 1 mm thick, so that corresponding metal pads are electrically connected. Such bonding may be realized by a silicon-oxide joining method where silicon oxide films exposed as an upper surface of each wafer are in contact with each other or a metal-joining process where metal pads of each wafer are in contact with each other.

After the two wafers are bonded, the resultant bonded wafer is inspected in order to check whether alignment accuracy falls within a predetermined criteria. This inspection may be performed by observing alignment marks on the respective wafers by irradiating infrared light onto the bonded wafer. Alternatively, the inspection may be performed by observing air bubbles or like remaining between the bonded wafers by irradiating ultrasonic waves onto the bonded wafer. When an inspection result is negative, the bonded wafer is separated into respective original wafers by using the wafer separating apparatus according to the embodiment. Then, the separated two wafers are aligned with each other and bonded.

Referring to FIG. 1, a wafer separating apparatus 10 according to this embodiment has a stage 12, a suctioning pin unit 14, and a separating arm unit 16. The stage 12 has a shape of circular plate, and an upper surface on which a bonded wafer WJ is placed. Additionally, the stage 12 is provided with a wafer chuck mechanism (not illustrated), which allows the wafer WJ placed on the upper surface to be held. With this, the bonded wafer WJ may be maintained flat on the upper surface of the stage 12 by the wafer chuck. The wafer chuck may be a vacuum chuck, which is capable of suctioning the bonded wafer WJ onto the upper surface of the stage 12, or an electrostatic chuck, which is capable of holding the bonded wafer WJ using Coulomb's force. Moreover, the stage 12 is movable in an upward and downward direction (or in a direction normal to the upper surface of the stage 12) by a stage driving mechanism 120. The stage driving mechanism 120 may also control the wafer chuck.

The suctioning pin unit 14 is movable in the upward and downward direction (or in the direction normal to the upper surface of the stage 12) by a suctioning pin unit driving mechanism 140. The suctioning pin unit 14 has plural suctioning pins 14P and a suctioning pin holding member 14H. The plural suctioning pins 14P may be provided so that the suctioning pins 14P are arranged along virtual concentric circles on the lower surface of the suctioning pin holding member 14H.

Each of the suctioning pins 14P has a shape of, for example, circular cylinder, and an inner tube (not illustrated) formed along a central axis thereof. The inner tube is in air communication with a conduit formed within the suctioning pin holding member 14H, and the conduit is in air communication with a suctioning mechanism 141 through a predetermined tubes 12L. When a lower end of each of the suctioning pins 14P is in contact with an upper surface of the bonded wafer WJ, the bonded wafer WJ is suctioned through the conduit and the inner tubes by the suctioning mechanism 141 and thus held by the suctioning pins 14P.

The suctioning pins 14P are provided to be independently movable in the upward and downward direction (or in vertical directions) by the suctioning pin unit driving mechanism 140. However, a group of suctioning pins 14P arranged along a particular one of the virtual concentric circles among the plural suctioning pins 14P may be movable in unison in vertical directions. In this case, the suctioning pin holding member 14H may include, for example, a central disk, an inner ring-shaped plate that surrounds the central disk, and an outer ring-shaped plate that surrounds the inner ring-shaped plate surrounding the central disk (not illustrated), which are mutually independently movable. When the suctioning pins 14P are arranged respectively on the lower surfaces of the central disk, the inner ring-shaped plate, and the outer ring-shaped plate, the suctioning pins 14P may move in vertical directions along with the corresponding ones of the central disk, the inner ring-shaped plate, and the outer ring-shaped plate.

Figure 2:
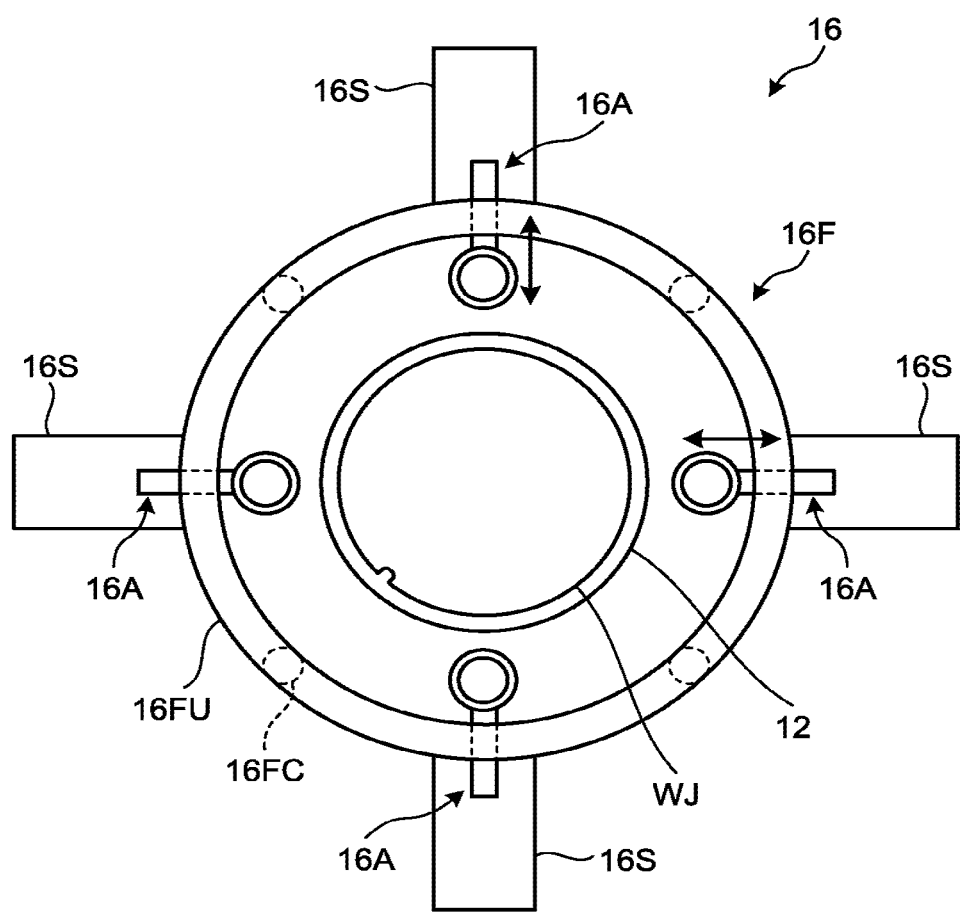
FIG. 2 is a plan view schematically illustrating a suctioning pin unit of the wafer separating apparatus according to the embodiment.

The separating arm unit 16 has separating arms 16A, a separating arm-supporting member 16S, and an annular frame 16F. Referring to FIG. 2, the annular frame 16F has a shape of ring, and has a size that is large enough to surround the stage 12. The annular frame 16F is arranged substantially concentrically with the stage 12. In this embodiment, the annular frame 16F has an upper ring 16FU, a lower ring 16FD (FIG. 1), and four supporting posts 16FC. The upper ring 16FU is secured above the lower ring 16FD by the supporting posts 16FC.

Around the annular frame 16F, the four separating arm-supporting members 16S are provided at equal intervals in a circumferential direction of the annular frame 16F in this embodiment. The separating arm-supporting members 16S support corresponding ones of the separating arms 16A movably in a forward and backward direction. Namely, each of the separating arms 16A is capable of moving in a direction advancing a center of the stage 12 along a radius direction of the stage 12, and in the opposite direction. Additionally, the separating arm-supporting member 16S is independently movable in the upward and downward direction by the separating arm unit driving mechanism 160 illustrated in FIG. 1.

Figure 3A:
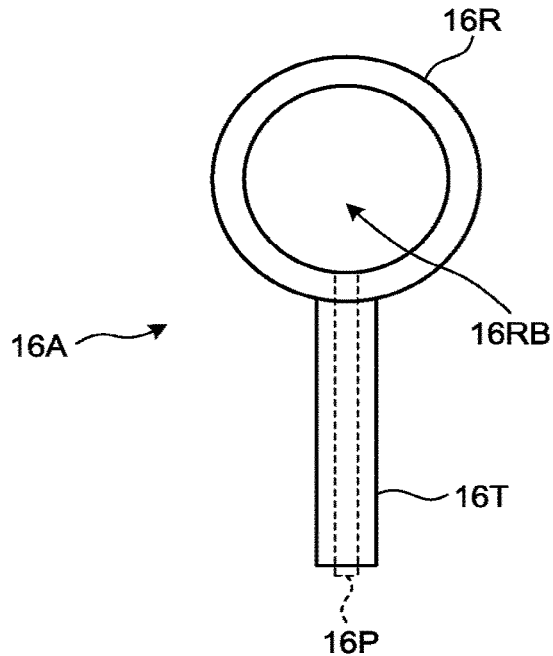
FIGS. 3A and 3B schematically illustrate a separating arm provided in the suctioning pin unit of the wafer separating apparatus according to the embodiment.
Figure 3B:
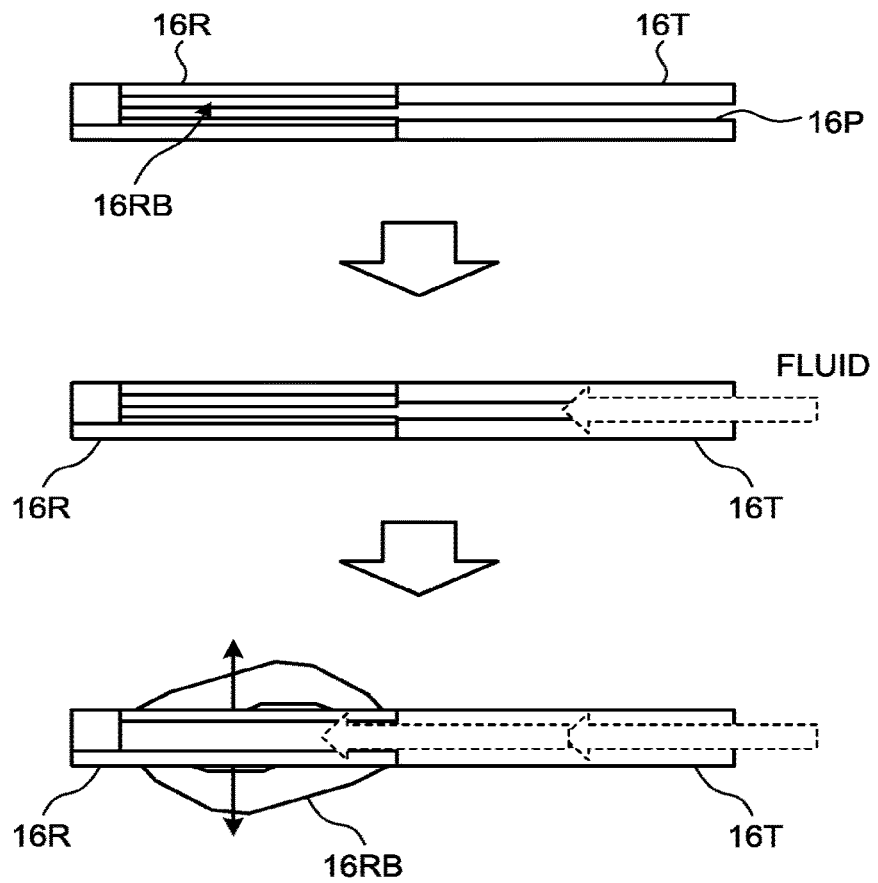

Referring to FIG. 3A, the separating arm 16A has a shaft 16T, a ring frame 16R, and an inflating portion 16RB. The inflating portion 16RB is formed of, for example, two circular sheets made of a flexible material such as a natural rubber and an artificial rubber. The inflating portion 16RB has a shape of bag where circumferential portions of the two circular sheets are air-tightly sealed, leaving one part unsealed. The inflating portion 16RB having such a shape is supported by the ring frame 16R. Specifically, the inflating portion 16RB is attached at the outer circumference thereof onto the ring frame 16R. For example, the inflating portion 16RB may be attached by sandwiching the outer circumference of the inflating portion 16RB with two rings that have the same shape to form the ring frame 16R.

Additionally, the shaft 16T of the separating arm 16A has a fluid supplying tube 16P inserted thereinto along a longitudinal direction of the shaft 16T. The fluid supplying tube 16P is connected at one end part thereof air-tightly with the unsealed part of the inflating portion 16RB. Moreover, the other end part of the fluid supplying tube 16P is connected with one end portion of a predetermined line 16L, and the other end portion of the line 16L is connected with a fluid control mechanism 161, as illustrated in FIG. 1. When a predetermined fluid is supplied from the fluid control mechanism 161 to the inflating portion 16RB through the line 16L and the fluid supplying tube 16P, the inflating portion 16RB inflates outward flexibly. Namely, the inflating portion 16RB inflates outward along a direction perpendicular to the longitudinal direction of the separating arm 16A from a central opening of the ring frame 16R.

Incidentally, as the fluid, inert gas (noble gas, nitrogen gas), pure wafer, or the like may be used. Additionally, a pressure of the supplied fluid may be controlled by the fluid control mechanism 161. Moreover, the fluid control mechanism 161 may allow the fluid that has been once supplied to the inflating portion 16RB to return. With this, the inflating portion 16RB can be deflated again.

Incidentally, the separating arms 16A may be formed of, for example, plastic or polymer materials, or metal. An outer diameter of the ring frame 16R may be determined taking a size of the bonded wafer WJ into consideration. For example, the outer diameter of the ring frame 16R may be several cm to several tens cm. A thickness of the ring frame 16R may be, for example, 1 to 2 mm.

Referring again to FIG. 1, the wafer separating apparatus 1 is provided with a controller 20 that comprehensively controls the wafer separating apparatus 10. The controller 20 may be realized by a processor provided with hardware, such as an application specified integrated circuit (ASIC), a programmable gate array (FGA), or a field programmable gate array (FPGA). Alternatively, the controller 20 may be configured as a computer including a central processing unit (CPU), a read only memory (ROM), a random access memory (RAM) and the like, and may be connected to a display device and an input/output device such as a key board and a computer mouse. The processor or the CPU outputs instruction signals to the stage driving mechanism 120, the suctioning pin unit mechanism 140, the separating arm driving mechanism 160, and the like in accordance with a predetermined computer program and various kinds of data. With this, the mechanisms 120, 140, 160 can be controlled. The computer program and the data may be downloaded to the controller 20 wirelessly or with wire from a non-transitory computer readable medium such as a hard disk drive (HDD), a server, or a semiconductor memory.

Next, referring to FIG. 4A through FIG. 8B, explanations are made on a wafer separating method using the above-described wafer separating apparatus 10. Operations of each part/member of the wafer separating apparatus 10, which are explained in the following, are performed based on instruction signals from the controller 20. In FIG. 4A through FIG. 8B, the stage driving mechanism 120, the suctioning pin unit driving mechanism 140, the separating arm driving mechanism 160, and the controller 20 are omitted, for the sake of simplicity.

Figure 4A:
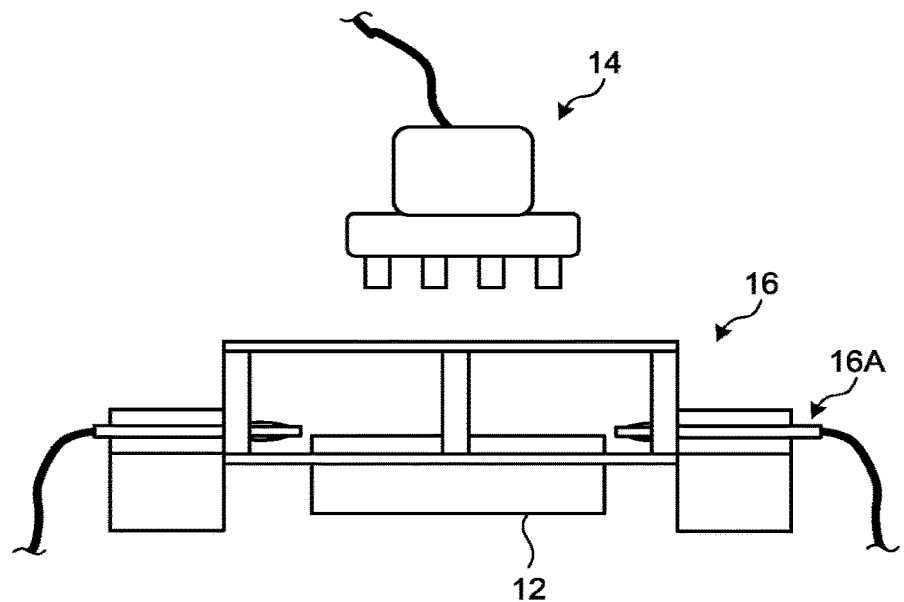
FIGS. 4A and 4B are schematic representations for explaining a wafer separating method performed by using the wafer separating apparatus according to the embodiment.
Figure 4B:
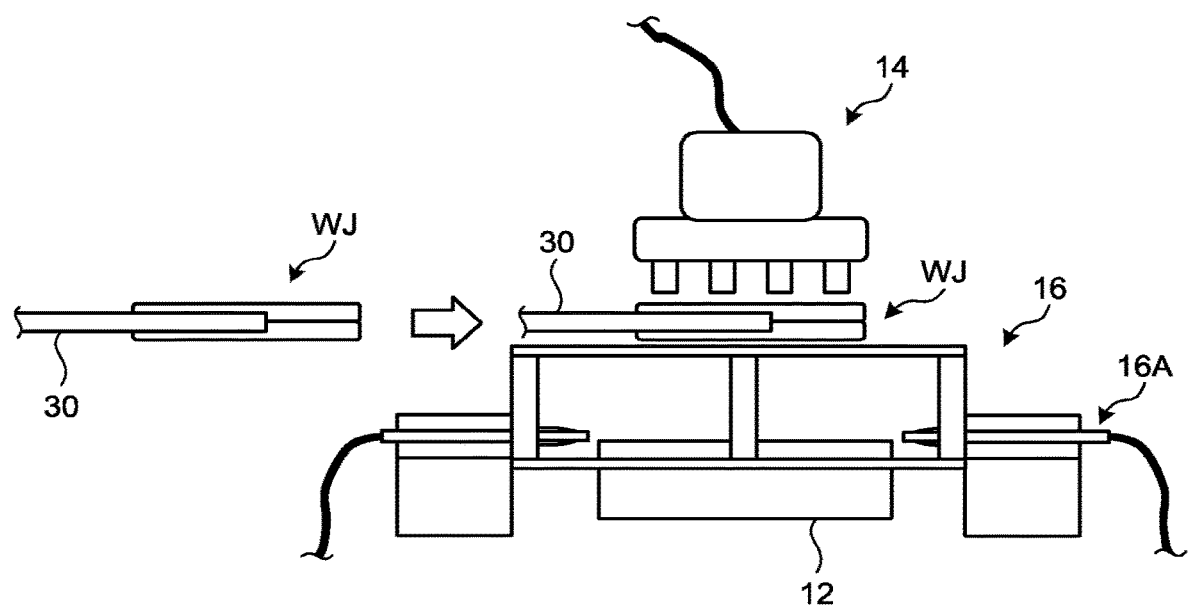

FIG. 4A is a side view schematically illustrating the wafer separating apparatus 10 in an initial status. As illustrated, the suctioning pin unit 14 is arranged above the separating arm unit 16 by the suctioning pin unit driving mechanism 140. Under such arrangement, the bonded wafer WJ is transferred to a space between the suctioning pin unit 14 and the separating arm unit 16 by a transfer arm 30, as illustrated in FIG. 4B. The transfer arm 30 is provided in a distal end portion of a transfer robot (not illustrated) and driven by the transfer robot. Incidentally, the bonded wafer WJ as a target of this wafer separating method may be housed in a sealable wafer container such as a Front Opening Unified Pod (FOUP). The bonded wafer WJ is brought out therefrom and transferred to the space by the transfer robot. Such a transfer robot and the transfer arm 30 may be controlled by the above-described controller 20.

Figure 5A:
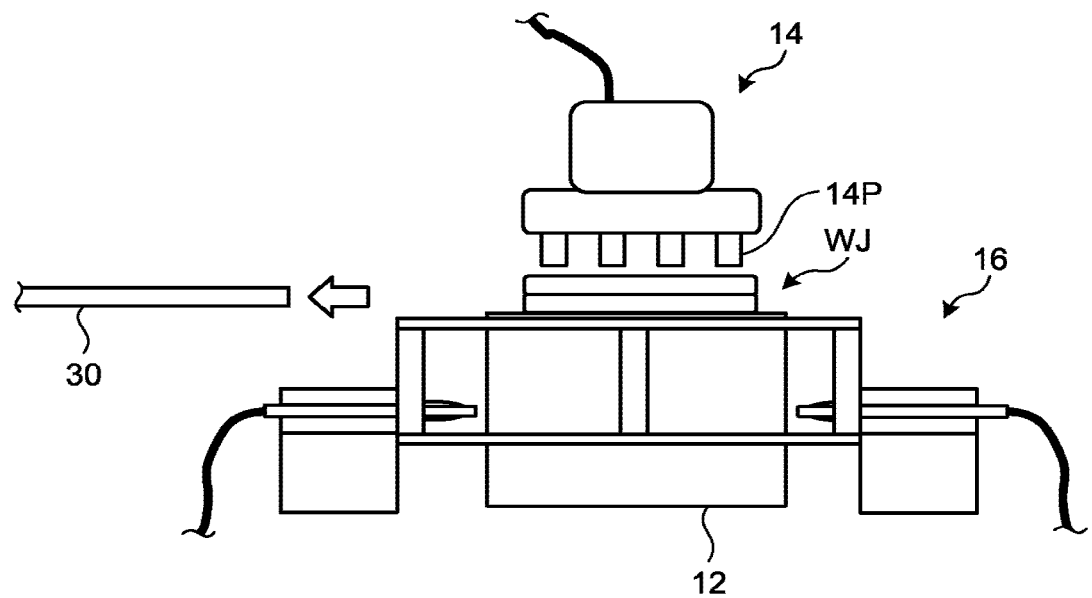
FIGS. 5A and 5B are additional schematic representations for explaining the wafer separating method performed by using the wafer separating apparatus according to the embodiment.

Then, as illustrated in FIG. 5A, the stage 12 is raised until an upper surface thereof meets the bonded wafer WJ. When the upper surface of the stage 12 is in contact with the bonded wafer WJ, the bonded wafer WJ is held onto the upper surface of the stage 12 by the wafer suctioning mechanism. After this, the transfer arm 30 is retreated, and then the transfer of the bonded wafer WJ from the transfer arm 30 onto the stage 12 is completed.

Figure 5B:
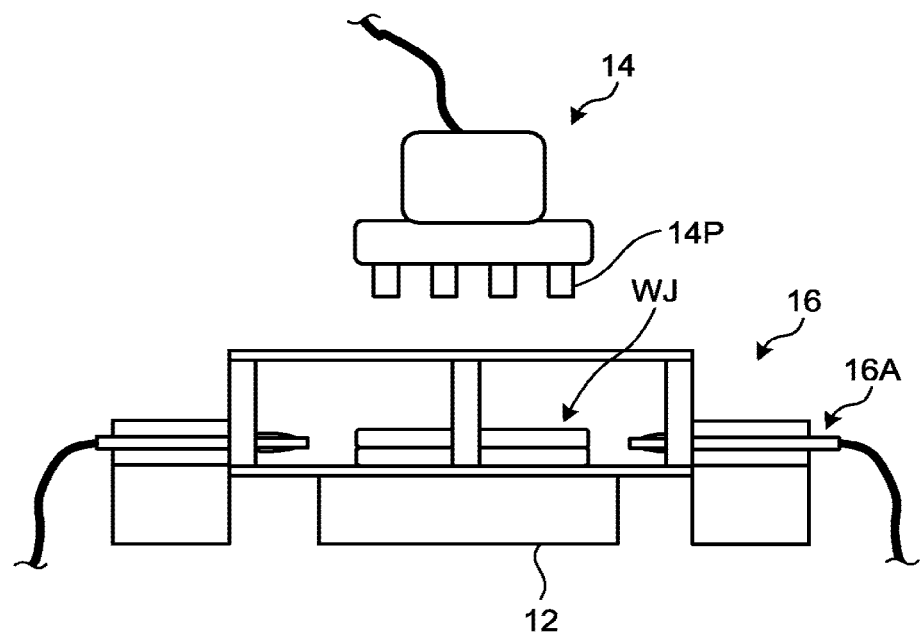
Figure 6A:
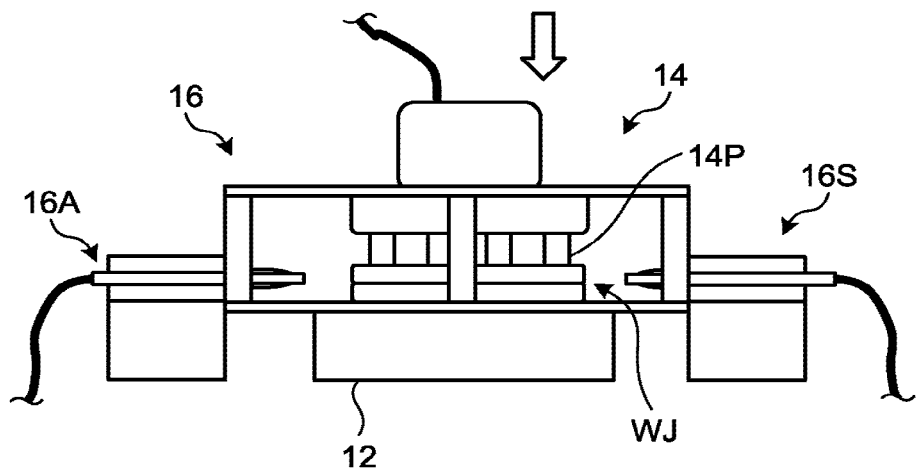
FIGS. 6A and 6B are more additional schematic representations for explaining the wafer separating method performed by using the wafer separating apparatus according to the embodiment.

Subsequently, as illustrated in FIG. 5B, when the stage 12 is brought down to the original position, the suctioning pin unit 14 are brought down until lower end portions of the suctioning pins 14P meet the upper surface of the bonded wafer WJ, as illustrated in FIG. 6A. When the lower end portions of the suctioning pins 14P are in contact with the upper surface of the bonded wafer WJ, the bonded wafer WJ is suctioned to the suctioning pins 14P by the suctioning mechanism 141 (FIG. 1).

Figure 6B:
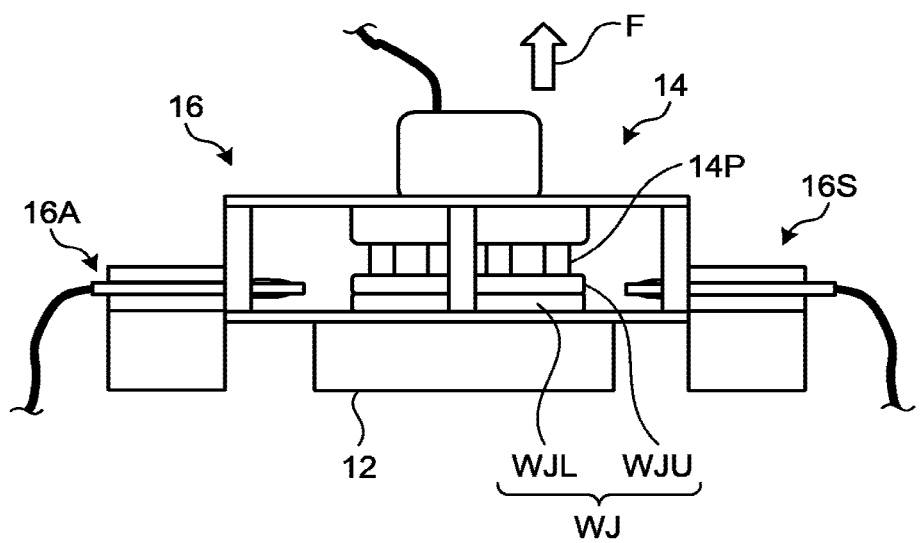

Then, as illustrated by an arrow F in FIG. 6B, an upward force is applied to the suctioning pin unit 14 by the suctioning pin unit driving mechanism 140. Namely, a lifting force is applied to an upper wafer WJU by the suctioning pins 14P.

Next, a positional adjustment in the upward and downward direction is performed on the separating arms 16A. This adjustment may be performed based on an image observation using, for example, an imaging sensor (not illustrated) provided in the separating arm unit 16. Namely, based on an image acquired by the imaging sensor, a bonded position at which the upper wafer WJU and a lower wafer WJL are bonded is detected. Then, a vertical position of the separating arm 16A is adjusted by the separating arm unit driving mechanism 160 so that a height difference becomes zero between the detected bonded position and a distal end portion of the separating arm 16A. Such adjustment is performed for all the separating arms 16A, and thus the distal end portions of all the separating arms 16A are in agreement with the bonded position.

After the positional adjustment is completed, each of the separating arms 16A moves toward the bonded wafer WJ by being driven by the separating arm unit driving mechanism 160. When the distal end portions of the separating arms 16A are pushed to the bonded portion of the upper wafer WJU and the lower wafer WJL of the bonded wafer WJ, a gap is generated therebetween. When the separating arms 16A are inserted into the gap and move toward the center of the bonded wafer WJ, circumferential portions of the two wafers WJU, WJL start being separated from each other. When the separating arms 16A move farther toward the center of the bonded wafer WJ and thus the inflating portions 16RB of the separating arms 16A also reach between the two wafers WJU, WJL, the fluid is supplied from the fluid control mechanism 161 to the inflating portions 16RB and thus inflating portions 16RB is inflated out. With this, a separating force is applied to the upper wafer WJU and the lower wafer WJL. Here, because the upward force is applied to the upper wafer WJU by the suctioning pins 14P while the lower wafer WJL is held by the stage 12, the circumferential portion of the upper wafer WJU is brought upward and thus the upper wafer WJU is bent upward. Incidentally, a pressure of the fluid supplied to the inflating portion 16RB is adjusted by the fluid control mechanism 161 so that the wafers WJU, WJL are not broken but separated from each other.

Figure 7A:
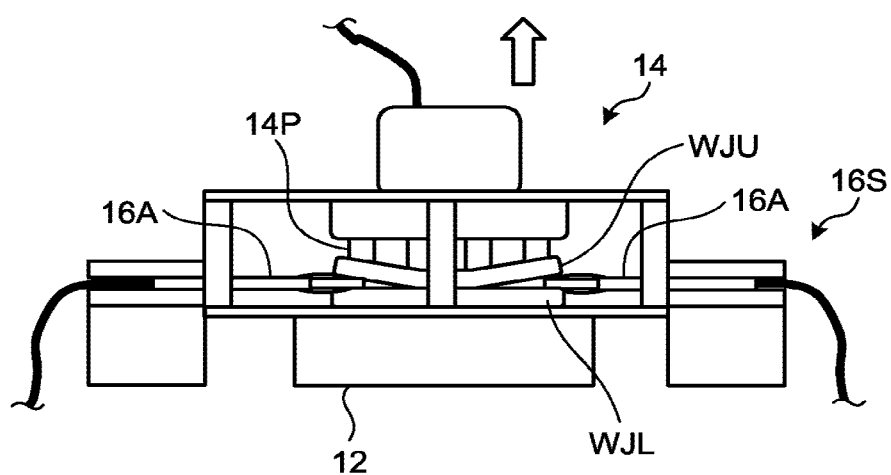
FIGS. 7A and 7B are yet more additional schematic representations for explaining the wafer separating method performed by using the wafer separating apparatus according to the embodiment.
Figure 7B:
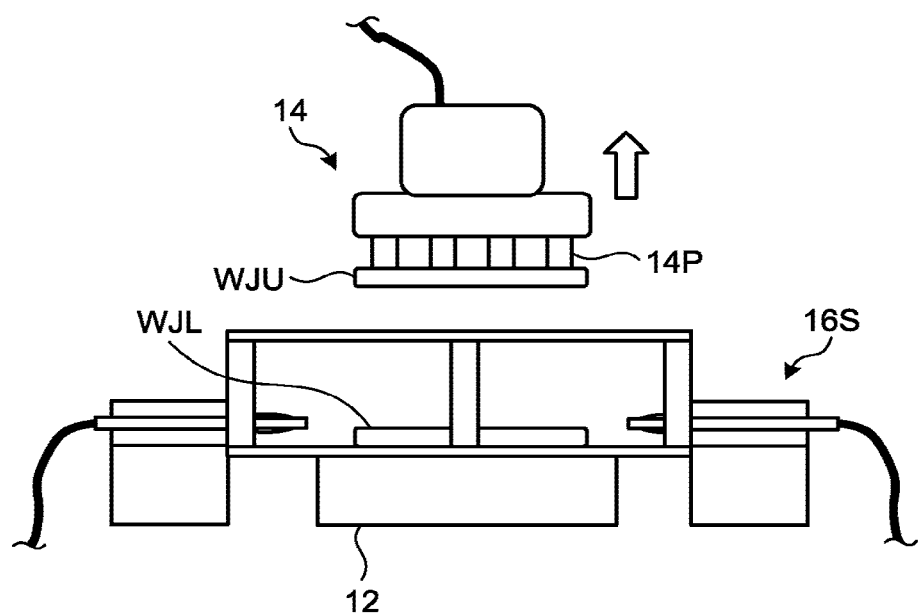

After this, when the separating arms 16A move farther toward the center of the bonded wafer WJ, the two wafers WJU, WJL of the bonded wafer WJ are separated from each other even in an area closer to the center of the bonded wafer WJ. Then, a further movement of the separating arms 16A toward the center of the bonded wafer WJ allows the two wafers WJU, WJL of the bonded wafer WJ to be separated even at the center thereof, and thus the upper wafer WJU is brought upward by the suctioning pin unit 14, as illustrated in FIG. 7B. In such a manner, the bonded wafer WJ is separated into the upper wafer WJU and the lower wafer WJL.

Subsequently, the separating arms 16A are retreated to the original position. Then, the fluid supplied to the inflating portion 16RB is stopped; the fluid inside the inflating portion 16RB is discharged; and thus the inflating portion 16RB becomes flat as before.

Figure 8A:
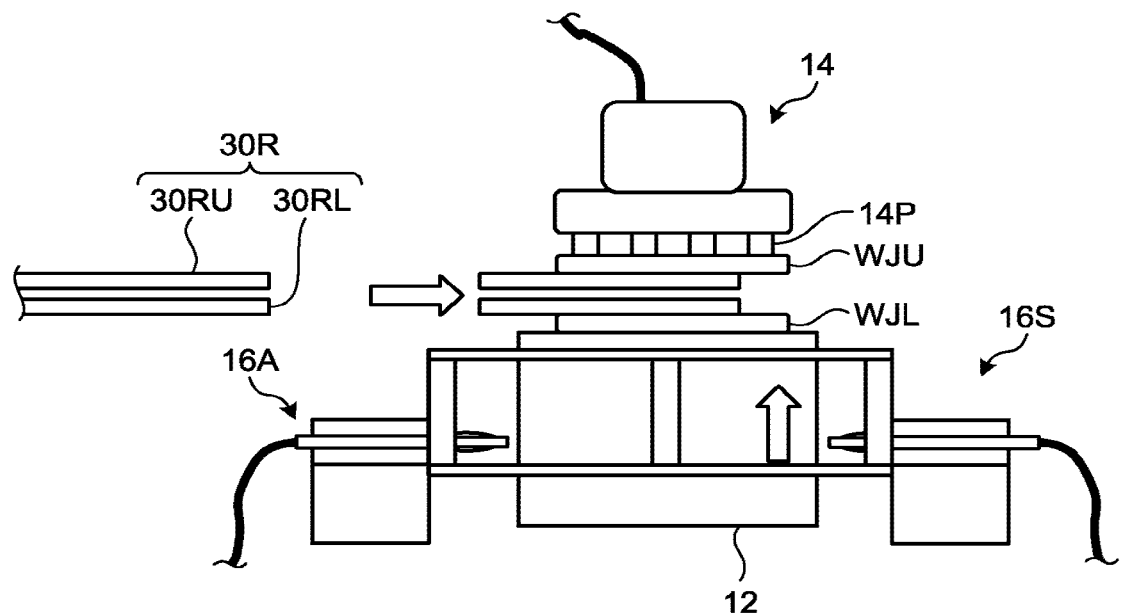
FIGS. 8A and 8B are further more additional schematic representations for explaining the wafer separating method performed by using the wafer separating apparatus according to the embodiment.
Figure 8B:
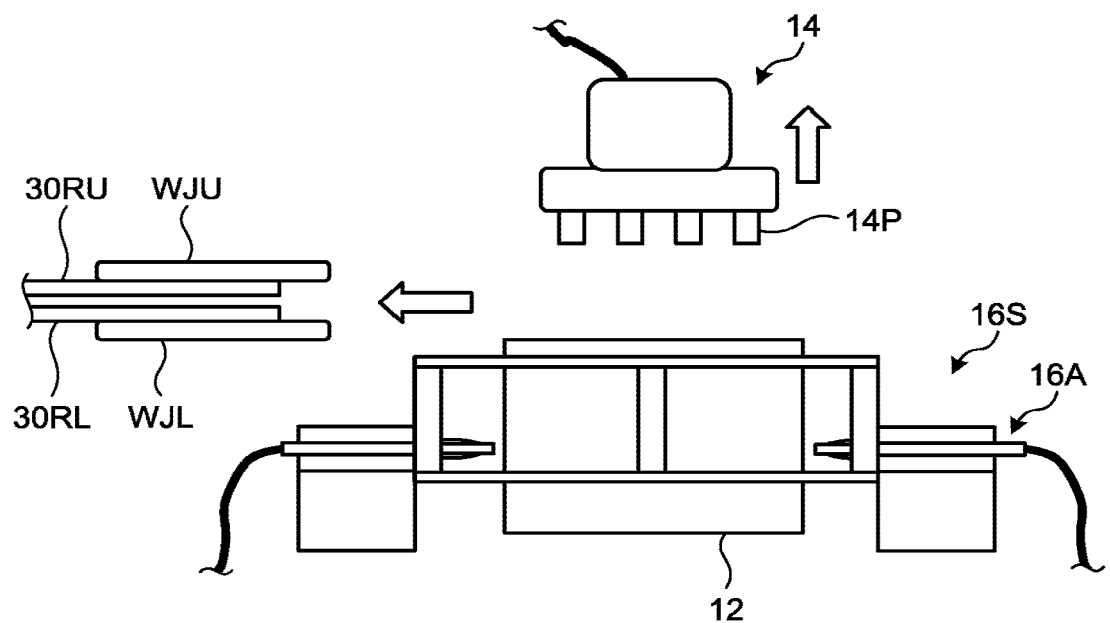

Then, a wafer transfer-out arm 30R proceeds into a space between the suctioning pin unit 14 and the separating arm unit 16. The wafer transfer-out arm 30R has an upper arm 30RU and a lower arm 30RL. The upper arm 30RU has a wafer suctioning mechanism on an upper side thereof; and the lower arm 30RL has a wafer suctioning mechanism on a lower side thereof. When the suctioning pin unit 14 is brought downward and the upper wafer WJU suctioned by the suctioning pin unit 14 meets the upper arm 30RU, the upper arm 30RU suctions the upper wafer WJU. Next, the suctioning pin unit 14 stops suctioning the upper wafer WJU, and thus the upper wafer WJU is transferred from the suctioning pin unit 14 to the wafer transfer-out arm 30R. Additionally, when the stage 12 is brought upward and thus the lower wafer WJL remaining on the stage 12 meets the lower arm 30RL, the lower arm 30RL suctions the lower wafer WJL. Then, the wafer suctioning mechanism of the stage 12 releases the lower wafer WJL, the lower wafer WJL is transferred from the stage 12 to the wafer transfer-out arm 30R (FIG. 8A). After this, as illustrated in FIG. 8B, the wafer transfer-out arm 30R transfers out the wafers WJU, WJL, and thus a series of wafer separating processes is completed.

As explained above, in the wafer separating apparatus 10 according to this embodiment and the wafer separating method using the same, the separating arm 16A provided with the inflating portion 16RB that is inflated out by supplying the fluid thereinto is inserted into the bonded portion of the wafers WJU, WJL that constitute the bonded wafer WJ. When the inflating portion 16RB reaches between the two wafers WJU, WJL, the fluid is supplied to the inflating portion 16RB. With this, the inflating portion 16RB is inflated outward along directions intersecting the upper surface of the stage 12. Therefore, force is applied to the wafers WJU, WJL so that these two wafers WJU, WJL are separated from each other. With this force, the upper wafer WJU is separated from the lower wafer WJL of the bonded wafer WJ.

Moreover, because the inflating portion 16RB having flexibility is inflated outward by the fluid, which allows the separating force to be applied to the two wafers WJU, WJL of the bonded wafer WJ, a strong abrupt force can be prevented from applying to the two wafers WJU, WJL. Therefore, breakage of the two wafers WJU, WJL, which may possibly be caused, can be reduced.

Furthermore, the upward force is applied by the suctioning pins 14P to the upper wafer WJU held onto the stage 12, which may facilitate the separating of the bonded wafer WJ by the separating arm 16A.

Additionally, in the separating arm 16A, when a size (i.e. a thickness, a difference between an outer diameter and an inner diameter, and the like) of the ring frame 16R to which the inflating portion 16RB is attached is appropriately adjusted, the ring frame 16R may be in contact with the bonded portion of the bonded wafer WJ in a decreased area thereof.

Incidentally, while the wafer separating apparatus 10 according to the above embodiment has the four separating arms 16A, the number of the separating arms 16A may be arbitrary determined, for example, taking account of a diameter and/or a thickness of the bonded wafer.

Additionally, although the separating arm 16A has the ring frame 16R of a ring shape, the separating arm 16A may have, for example, a U-shape frame instead of the ring frame 16R. In this case, an inflating portion, which inflates outward from the U-shape frame, may be provided to occupy an inside area of the U-shape ring frame. Such an inflating portion may also have a U-shape. The separating arm so configured may be inserted into a bonded position of the bonded wafer, from either one of an upper end portion and a lower end portion of the U-shape. When the upper end portion of the U-shape is the inserting end portion, an air-tightly closed straight portion of the inflating portion is to be inserted into the bonded portion of the bonded wafer WJ. Alternatively, when the lower end portion of the U-shape is the inserting end portion, the separating arm may have a shaft connected to the upper end portion of the U-shape frame, the shaft corresponding to the shaft 16T. Such a shaft may have the same width as the upper end portion of the U-shape frame.

Additionally, a thickness of the ring frame 16R of the separating arm 16A may become thinner toward the distal end portion thereof (a portion that is to meet the bonded portion of the bonded wafer WJ). With this, the separating arm 16A can be easily inserted into the bonded portion of the bonded wafer WJ. In this case, the positional adjustment may be performed, for example, by vertically moving the thinner distal end portion while being kept in contact with an edge portion of the bonded wafer WJ in order to find the bonded portion of the bonded wafer WJ.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A wafer separating method comprising:
   supporting a bonded wafer formed of two wafers bonded with each other by a wafer supporting member having an upper surface on which the bonded wafer is placed;
   inserting a distal end portion of a predetermined arm portion into a bonded portion of the bonded wafer supported by the wafer supporting member; and
   inflating an inflating portion provided in the distal end portion of the arm portion in a direction intersecting the upper surface of the wafer supporting member.

2. The wafer separating method according to claim 1, wherein the inflating portion is inflated by fluid supplied thereto.

3. The wafer separating method according to claim 1, further comprising attracting, by way of an attracting pin, one of the two wafers of the bonded wafer, the one of the two wafers being opposite to the other one of the two wafers being in contact with the wafer supporting member.

4. The wafer separating method according to claim 3, further comprising applying, by way of the attracting pin, force to the one of the two wafers so that the one of the two wafers moves away from the other one of the two wafers.

5. The wafer separating method according to claim 1, further comprising adjusting the distal end portion to be in alignment with the bonded portion, prior to the inserting the distal end portion into the bonded portion.

\* \* \* \* \*